United States Patent
Phan

(10) Patent No.: US 8,310,292 B1
(45) Date of Patent: Nov. 13, 2012

(54) METHOD FOR RESETTING DLL WITH FREQUENCY CHANGE APPLICATION

(75) Inventor: John T. Phan, Sugar Land, TX (US)

(73) Assignee: Nanya Technology Corp., Kuelshan, Tao-Yuan Hsien (TW)

( * ) Notice: Subject to any disclaimer, the term of this patent is extended or adjusted under 35 U.S.C. 154(b) by 11 days.

(21) Appl. No.: 13/182,440

(22) Filed: Jul. 13, 2011

(51) Int. Cl.
*H03L 7/06* (2006.01)

(52) U.S. Cl. ......... 327/158; 327/142; 327/149; 327/161

(58) Field of Classification Search .............. 327/142, 327/149, 153, 158, 161, 198; 365/233.1–233.5
See application file for complete search history.

(56) References Cited

U.S. PATENT DOCUMENTS

| | | | |
|---|---|---|---|
| 6,452,431 B1 * | 9/2002 | Waldrop | 327/158 |
| 7,119,589 B2 * | 10/2006 | Tseng | 327/156 |
| 7,358,784 B2 * | 4/2008 | Kim et al. | 327/158 |
| 7,733,138 B2 * | 6/2010 | Uehara et al. | 327/158 |
| 2012/0212273 A1 * | 8/2012 | Nguyen et al. | 327/276 |

* cited by examiner

*Primary Examiner* — Patrick O'Neill
(74) *Attorney, Agent, or Firm* — Winston Hsu; Scott Margo

(57) ABSTRACT

A DLL system that automatically resets after a frequency change of an external clock according to a phase difference includes: a clock receiver for receiving the external clock and generating a clock signal; a delay line, coupled to the clock receiver, for generating a delayed clock signal; a control loop, for tracking a phase difference between the clock signal and the delayed clock signal and locking the delay line when the phase difference is zero; and an N degrees phase detector (PD), coupled to the control loop, for detecting the phase difference between the clock signal and the delayed clock signal and outputting a positive signal when the detected phase difference is greater than N degrees, wherein the positive signal generates a reset signal to the DLL system.

10 Claims, 4 Drawing Sheets

METHOD FOR RESETTING DLL WITH FREQUENCY CHANGE APPLICATION

BACKGROUND OF THE INVENTION

1. Field of the Invention

This invention relates to DLLs, and more particularly, to a DLL with automatic reset functionality.

2. Description of the Prior Art

Delay Locked Loops (DLLs) are devices comprising a variable delay line in a first-order feedback loop that lock an output phase with an input reference signal. A typical application of DLLs is in DRAMs, where they are used to synchronize the DRAM data output strobe (DQS) and data (DQ) with the external clock input (VCLK).

When the DLL is in a lock state, the rising edge of the data strobe will align with the rising edge of the external clock. This behavior should remain stable over a defined clock frequency of the system.

When the external clock frequency changes after the DLL is locked, the DLL must track and re-lock to the new phase. Although most systems issue DLL reset each time the clock frequency changes according to the JEDEC specification, this does not occur in every system, and the DLL will therefore have to re-sync to the correct edge from the original sync position. If the phase shift is small, the DLL will be able to perform this operation relatively quickly, but if the phase shift is great, the DLL will take a long time to re-sync.

SUMMARY OF THE INVENTION

Therefore, it is an objective of the present invention to design a DLL that will automatically reset itself after a change in clock frequency with a large phase shift.

A DLL system that automatically resets after a frequency change of an external clock according to a phase difference comprises: a clock receiver for receiving the external clock and generating a clock signal; a delay line, coupled to the clock receiver, for generating a delayed clock signal; a control loop, for tracking a phase difference between the clock signal and the delayed clock signal and locking the delay line when the phase difference is zero; and an N degrees phase detector (PD), coupled to the control loop, for detecting the phase difference between the clock signal and the delayed clock signal and outputting a positive signal when the detected phase difference is greater than N degrees, wherein the positive signal generates a reset signal to the DLL system. The DLL system further comprises a logic unit, coupled to the N degrees PD and an external signal of the DLL system, which provides the reset signal to the DLL system when at least one of the positive signal and the external signal is received.

A method for automatically resetting a DLL system after a frequency change of an external clock comprises: receiving the external clock as a clock signal; generating a delayed clock signal; detecting a phase difference between the clock signal and the delayed clock signal; outputting a positive signal when the detected phase difference is greater than N degrees; and generating a reset signal to the DLL system according to the positive signal. The method also comprises receiving an external signal, wherein the reset signal is generated according to at least one of the positive signal and the external signal.

These and other objectives of the present invention will no doubt become obvious to those of ordinary skill in the art after reading the following detailed description of the preferred embodiment that is illustrated in the various figures and drawings.

DETAILED DESCRIPTION

The present invention aims to provide a DLL that can automatically reset when there is a large change in phase of an external clock signal.

As described in the background section, when there is a change in the external clock of a DLL, the internal clock will shift. Without reset, the DLL must track and re-sync to the correct edge of the shifted clock. Depending on the phase difference, it is faster to reset the DLL than have it re-track. Therefore, the present invention provides a means for generating an internal reset signal according to a detected phase difference. In the following description, 180 degrees is taken as an exemplary threshold value: if a phase shift is below 180 degrees, no automatic reset signal will be generated; and if the phase shift is more than 180 degrees, the DLL system will generate a reset signal. Please note, however, that any value can be selected as the threshold value for automatic resetting, and one skilled in the art would be able to make the necessary modifications for implementing a different threshold value after reading the disclosure.

Figure 1:
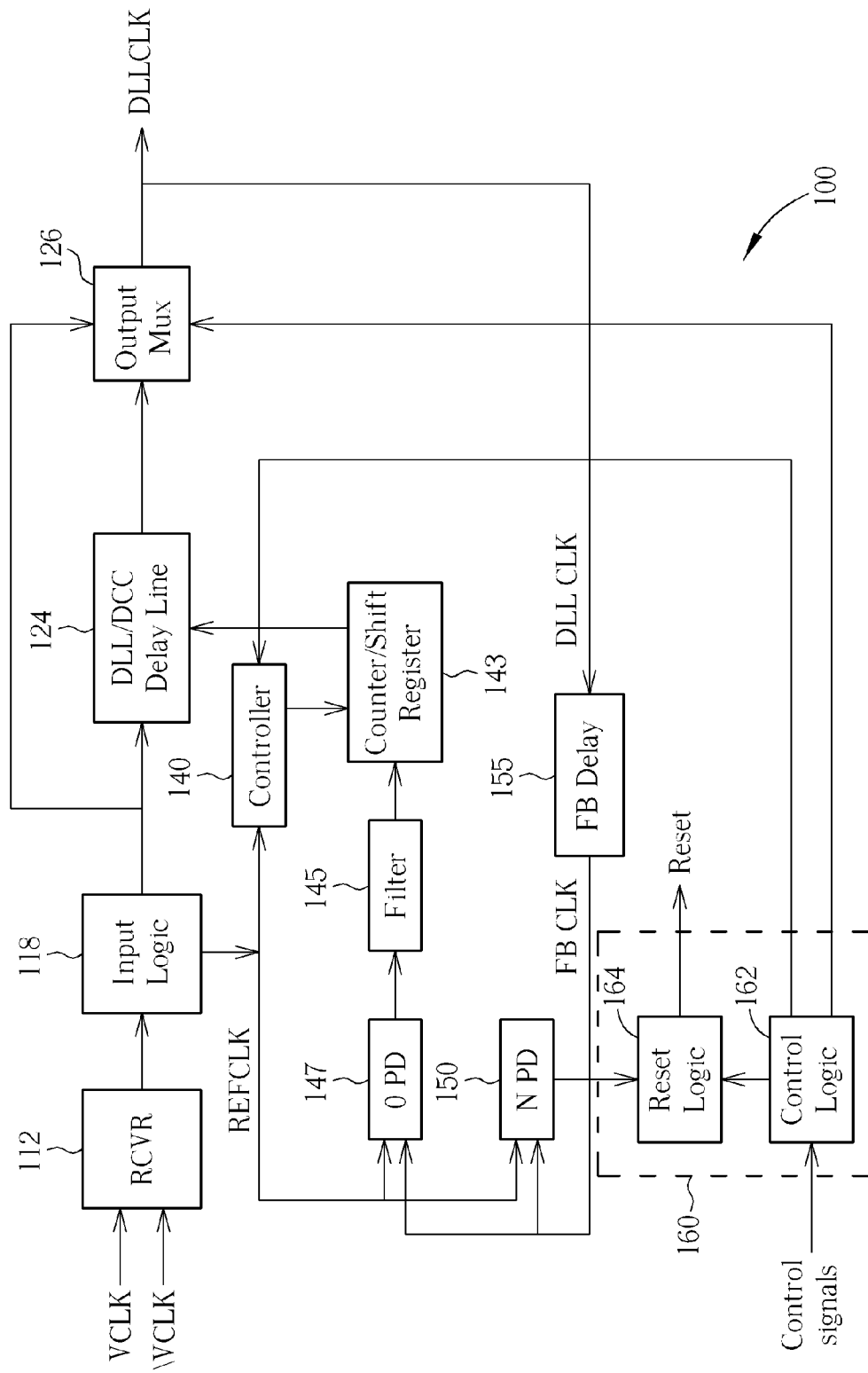
FIG.1 shows a DLL system with automatic reset according to an exemplary embodiment of the present invention.

Please refer to FIG. 1, which is a diagram of a DLL system 100 according to an exemplary embodiment of the present invention. The diagram shows a DLL delay line 124 used in a DRAM; however, this is merely for illustration purposes. The DLL system 100 with automatic reset described herein can be utilized in a variety of devices.

The DLL system 100 comprises clock receivers 112, 114, which receive a differential clock signal VCLK, \VCLK. This clock signal is input to an input clock 118 which generates an input clock signal REFCLK, and then input to the DLL/DCC delay line 124. The DLL/DCC delay line 124 will track to the input signal and provide a delayed signal DLLCLK, via an output Mux 126. The output Mux also receives REFCLK from the input clock 118. The output Mux 126 selects between REFCLK and the delayed signal DLLCLK according to a DLL/DCC bypass input which is programmable by the system or by an end user.

The delayed clock signal DLLCLK and REFCLK are input to a control/reset loop, comprising a control counter 140, a counter/shift register 143, a filter 145, a feedback (FB) delay unit 155, and phase detectors 147, 150. This control/reset loop is coupled to the DLL/DCC delay line 124, and also coupled to a DLL logic unit 160, comprising a control logic 162 and a reset logic 164.

In the conventional art, a DLL system only comprises the 0 degree phase detector (0° PD) 147, which is utilized during locking and tracking. Furthermore, in the conventional art, the above-described loop is only a control loop, used for providing feedback to the delay line 124. The present invention, however, further provides a 180 degrees phase detector (180° PD) 150 that is coupled to the 0° PD 147, the FB delay unit 155 and the output of the input clock 118. This 180° PD 150 is used to provide an automatic reset function to the DLL system 100. The method will be described in the following.

As detailed above, when the phase shift of the external differential clock VCLK, \VCLK is greater than 180 degrees, it is faster for the DLL system 100 to automatically reset rather than attempting to re-track to the shifted clock signal. The 180° PD 150 thereby provides an automatic reset function, by comparing the phase of the delayed clock signal DLLCLK with the external differential clock signal VCLK, \VCLK, according to the signal REFCLK output by the input clock 118. When the 180° PD 150 detects that there is a phase difference between the external clock signal and the delayed clock signal that is greater than 180 degrees, it will output a signal (a positive detection signal) to the reset logic 164 in the logic unit 160. The logic unit 160 also receives external control signals through the control logic 162, which instruct the DLL system 100 to reset; for example, during power-up. The logic unit 160 can thereby reset the DLL system 100 according to the external control signals, or when the 180° PD 150 detects a phase difference greater than 180 degrees, i.e. when it outputs a positive signal. In this way, automatic resetting is enabled when a significant phase difference occurs, while still allowing external reset functionality of the DLL system 100. When a phase difference less than 180 degrees occurs, the 180° PD 150 will not affect the normal workings of the DLL system 100, and reset can occur according to the external control signals only.

Figure 2A:
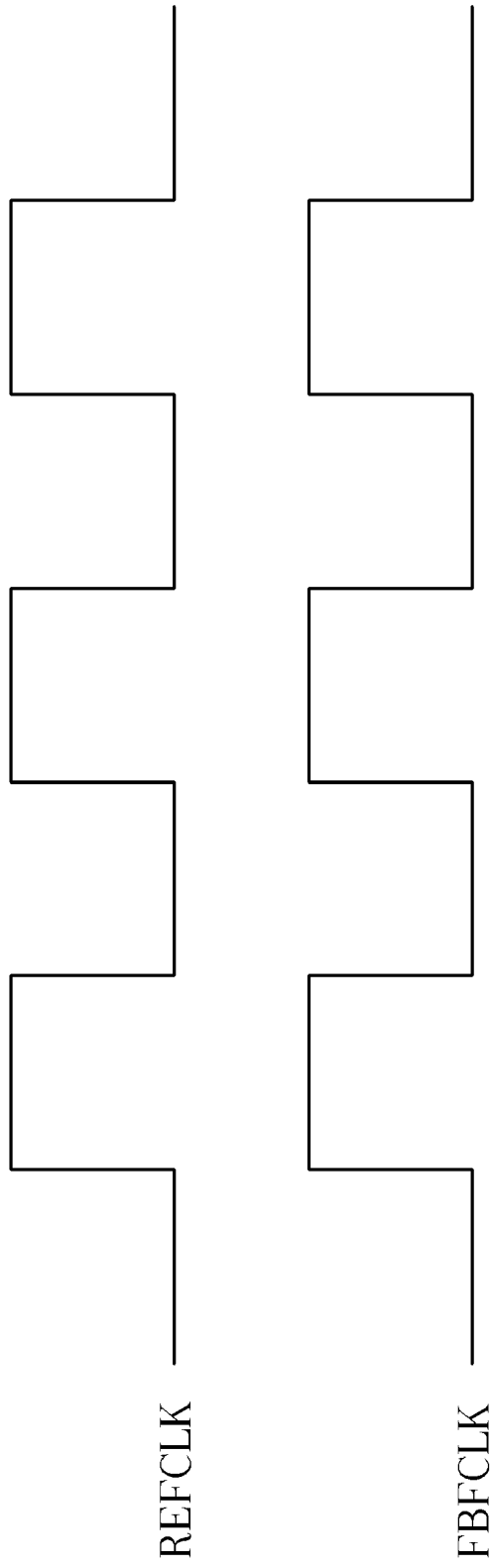
FIG.2A shows a timing diagram for the DLL system shown in FIG.1 according to a first received clock signal.
Figure 2B:
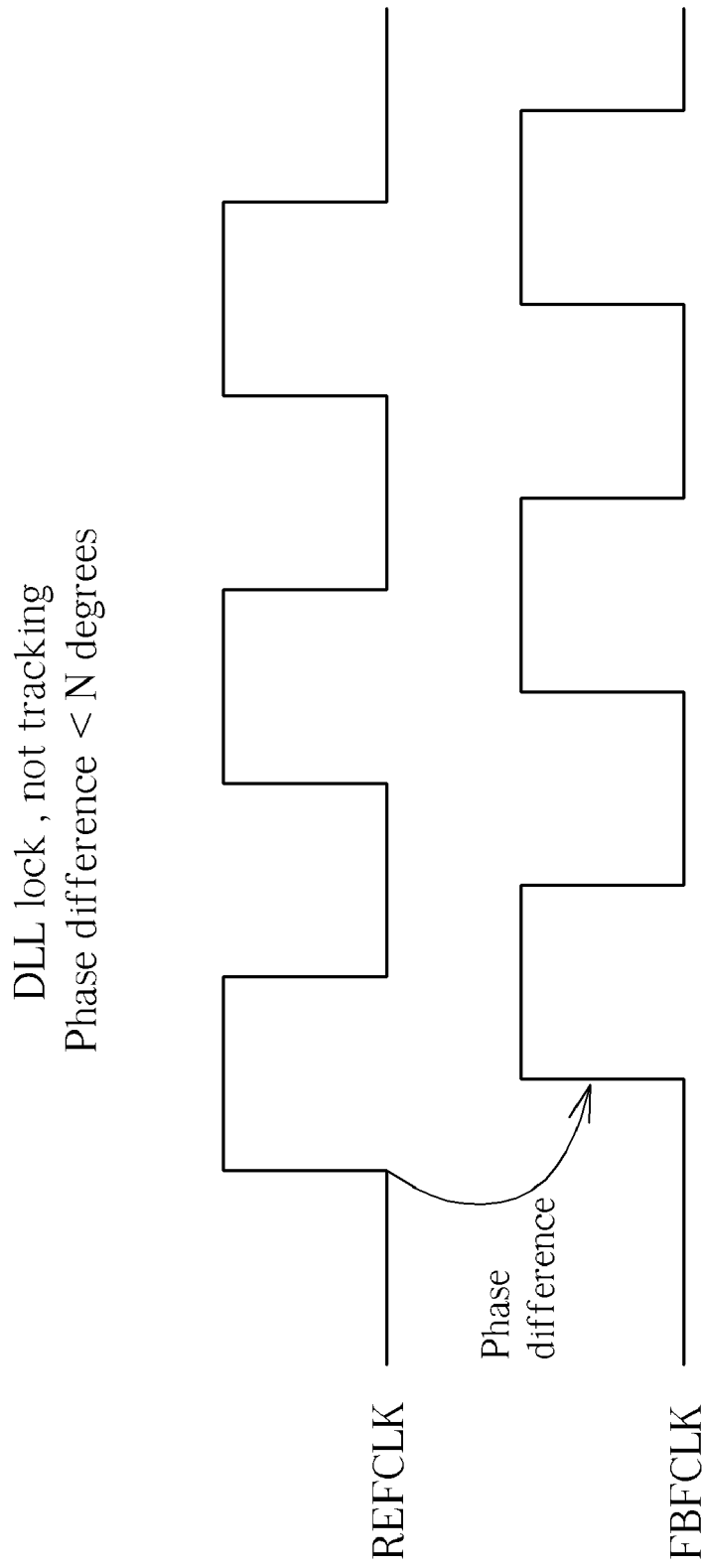
FIG.2B shows a timing diagram for the DLL system shown in FIG.1 according to a second received clock signal.
Figure 2C:
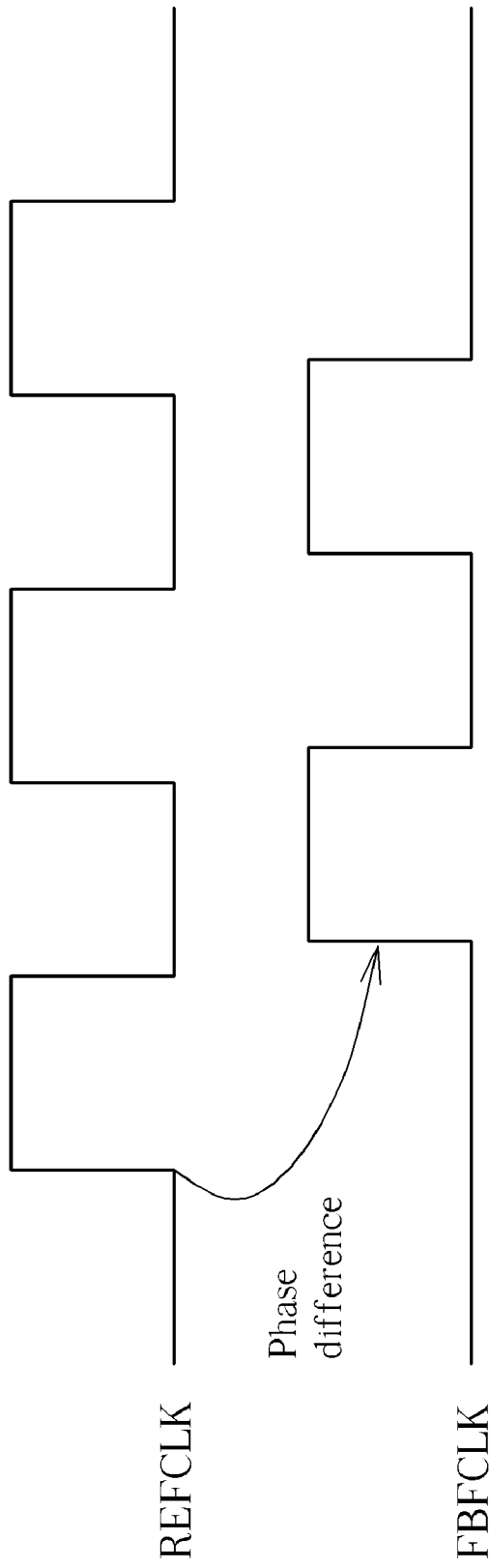
FIG.2C shows a timing diagram for the DLL system shown in FIG.1 according to a third received clock signal.

Please refer to FIGS. 2A, 2B and 2C, which respectively show three timing diagrams detailing possible situations that occur when the DLL system 100 is in operation. In FIG.2A the DLL system 100 is locked and is tracking to the external signal. REFCLK and FBCLK are in phase and therefore there is no output from the 180° PD 150. In FIG.2B, the DLL system 100 is locked to the original signal but the external clock has changed, resulting in REFCLK and FBCLK being out of phase. As the phase difference between REFCLK and FBCLK is less than 180 degrees, there is no output from the 180° PD 150, so the DLL system will re-track REFCLK and re-sync to the correct edge. The small phase difference means this re-syncing can occur quickly and therefore there is no need for the DLL system 100 to reset. In FIG.2C, the external signal has shifted again and REFCLK and FBCLK are now more than 180 degrees out of phase. The 180° PD 150 will register the phase shift and therefore output a signal to the reset logic, instructing the DLL system 100 to reset. This allows the DLL system 100 to lock to REFCLK faster than through re-tracking and re-syncing.

To conclude, the present invention provides a DLL system 100 that can automatically reset when a large phase difference between the external clock and internal clock occurs. The implementation of the 180° PD serves to force a reset when a phase difference is too great for fast re-tracking of the DLL to take place. The implementation of the reset logic 164 within the logic unit 160 means that reset can occur according to the detected phase difference and/or an external input, meaning existing reset functionality of the system is not affected. Thereby, a DLL with fast locking ability after clock frequency change is provided.

Those skilled in the art will readily observe that numerous modifications and alterations of the device and method may be made while retaining the teachings of the invention.

What is claimed is:

1. A DLL system that automatically resets after a frequency change of an external clock according to a phase difference, comprising:
   a clock receiver for receiving the external clock and generating a clock signal;
   a delay line, coupled to the clock receiver, for generating a delayed clock signal;
   a control loop, for tracking a phase difference between the clock signal and the delayed clock signal and locking the delay line when the phase difference is zero; and
   an N degrees phase detector (PD), coupled to the control loop, for detecting the phase difference between the clock signal and the delayed clock signal and outputting a positive signal when the detected phase difference is greater than N degrees, wherein the positive signal generates a reset signal to the DLL system.

2. The DLL system of claim 1, further comprising:
   a logic unit, coupled to the N degrees PD and an external signal, for providing the reset signal to the DLL system when at least one of the positive signal and the external signal is received.

3. The DLL system of claim 2, wherein the logic unit comprises:
   a control logic, coupled to the external signal, for generating at least a control signal according to the external signal; and
   a reset logic, coupled to the positive signal and the control signal for generating the reset signal according to at least one of the positive signal and the control signal.

4. The DLL system of claim 3, wherein when the phase difference between the clock signal and the delayed clock signal is less than N degrees, the reset logic generates the reset signal to the DLL system according to the control signal only.

5. The DLL system of claim 1, wherein N=180.

6. A method for automatically resetting a DLL system after a frequency change of an external clock, comprising:
   receiving the external clock as a clock signal;
   generating a delayed clock signal;
   detecting a phase difference between the clock signal and the delayed clock signal;
   outputting a positive signal when the detected phase difference is greater than N degrees; and
   generating a reset signal to the DLL system according to the positive signal.

7. The method of claim 6, further comprising:
   when the detected phase difference is less than N degrees, continually tracking the phase difference, and locking the delay line when the phase difference is zero.

8. The method of claim 6, wherein the step of generating a reset signal to the DLL system according to the positive signal further comprises:
   receiving an external signal and generating the reset signal according to at least one of the positive signal and the external signal.

9. The method of claim 8, wherein when the detected phase difference is less than N degrees, the reset signal is generated according to the external signal only.

10. The method of claim 6, wherein N=180.

* * * * *